United States Patent [19]

Lindquist et al.

[11] Patent Number: 5,579,347
[45] Date of Patent: Nov. 26, 1996

[54] DIGITALLY COMPENSATED DIRECT CONVERSION RECEIVER

[75] Inventors: Björn Lindquist, Bjarred; Martin Isberg, Lund; Heino Wendelrup, Malmö; Martin Sallenhag; Kjell Gustafsson, both of Lund, all of Sweden

[73] Assignee: Telefonaktiebolaget LM Ericsson, Stockholm, Sweden

[21] Appl. No.: 365,037

[22] Filed: Dec. 28, 1994

[51] Int. Cl.$^6$ .............................. H03D 1/22; H04B 1/12; H04B 1/30

[52] U.S. Cl. .................... 375/346; 455/296; 455/324

[58] Field of Search ........................ 375/346; 455/324, 455/296, 295, 310, 312

[56] References Cited

U.S. PATENT DOCUMENTS

| | | | |
|---|---|---|---|
| 4,163,940 | 8/1979 | Brewerton | 324/132 |
| 4,416,017 | 11/1983 | Jasper et al. | 375/346 |
| 4,583,239 | 4/1986 | Vance | 375/324 |
| 4,736,455 | 4/1988 | Matsue et al. | 455/138 |
| 4,970,469 | 11/1990 | Kasperkovitz | 329/325 |
| 5,241,702 | 8/1993 | Dent | 455/278.1 |
| 5,422,889 | 6/1995 | Sevenhans et al. | 455/324 |

FOREIGN PATENT DOCUMENTS

| | | | |
|---|---|---|---|
| 542520 | 5/1993 | European Pat. Off. | |
| 598277 | 5/1994 | European Pat. Off. | |
| 2633476 | 3/1977 | Germany | 455/296 |
| 3240565 | 5/1984 | Germany | |
| 0215120 | 9/1988 | Japan | 455/296 |
| 177787 | 6/1994 | Japan | 455/296 |
| 2130826 | 6/1984 | United Kingdom | |
| 2170368 | 7/1986 | United Kingdom | |
| 2213337 | 8/1989 | United Kingdom | 455/295 |
| WO92/01337 | 1/1992 | WIPO | |

*Primary Examiner*—Stephen Chin
*Assistant Examiner*—Jeffrey W. Gluck
*Attorney, Agent, or Firm*—Burns, Doane, Swecker & Mathis, L.L.P.

[57] ABSTRACT

A digitally compensated direct-conversion receiver includes devices for generating digital samples of a base-band in-phase signal and a base-band quadrature signal and for detecting the presence of a second-order product signal produced by an amplitude-modulated interfering signal. Also, the apparatus comprises a device for digitally compensating the digital samples by removing the second-order product signal, thereby producing compensated digital samples. In one method of digitally compensating samples of an information signal quadrature-modulating a carrier signal, estimated samples of a second-order product from a switched carrier signal are formed by averaging the digital samples during two time periods and by determining a time of ramps in the in-phase and quadrature signals that occur between the time periods due to the interfering signal. The digital samples may be differentiated and the results smoothed in determining the time of the ramps. In another apparatus, the estimated samples of the second-order product signal are produced by a device for averaging a square of a difference between respective digital samples of the in-phase signal and the quadrature signal, thereby determining an amplitude of the amplitude-modulated carrier signal, and a device for combining the amplitude and the digital samples, thereby generating the estimated samples.

16 Claims, 5 Drawing Sheets

Fig. 1a *PRIOR ART*

DIGITALLY COMPENSATED DIRECT CONVERSION RECEIVER

BACKGROUND

The invention relates to a direct-conversion receiver for radio communication systems such as portable cellular phones, cordless phones, pagers, etc.

The first generation of cellular systems relied on analog frequency modulation for speech transmission, and several standards have been developed, e.g., NMT 450, NMT 900, AMPS, and ETACS.

The second generation of cellular systems, e.g., the Global System for Mobile communications (GSM) in Europe and the American Digital Cellular System (ADC) in North America, employ digital voice transmission and some digital services, such as facsimile and short message services.

Receivers in cellular systems and the other fields noted above are preferably small, lightweight, and inexpensive. To make a portable receiver like a hand-held telephone smaller and less expensive, much research has been done to increase the level of integration of different parts of the phone. But previous receivers have been of the conventional heterodyne type. For applications in small, low-cost mobile communication systems, such receivers suffer from high production costs caused by expensive and non-integrable components, such as bandpass filters.

To overcome such drawbacks, an alternative receiver architecture has been developed that is based on the direct-conversion principle, in which the frequency of the local oscillator is the same as the frequency of the received radio carrier. Consequently, the received radio signal is down-converted directly to base band in one step. Since a direct-conversion receiver does not have any intermediate frequency (IF) stages, many filters can be omitted or simplified.

Direct conversion was introduced for single-sideband receivers in the 1950's, but the technique is not limited to such systems. Direct conversion can be used with many different modulation schemes and is especially well suited for the quadrature modulation schemes of today, such as minimum shift keying (MSK) and quadrature amplitude modulation (QAM). Various aspects of direct-conversion or homodyne receivers are described in U.S. patent application Ser. No. 08/303,183 entitled "Radio Receiver" by two of the current Applicants.

The operation of a conventional direct-conversion receiver can be described as follows with reference to FIG. 1a. A radio frequency (RF) signal having center frequency $f_c$ and bandwidth $BW_{rf}$ is received by an antenna 10 and then is filtered by a bandpass filter 20. The filtered signal produced by the bandpass filter is amplified by an amplifier 30, which preferably has low noise to improve the total noise figure of the receiver.

The amplified filtered signal produced by the amplifier 30 is then down-converted to base band in an in-phase (I) channel and a quadrature phase (Q) channel by balanced mixers 40, 50. The mixers are driven by respective ones of sine (I) and cosine (Q) components produced from a sinusoidal signal generated by a local oscillator 60 by a suitable divider and phase shifter 70. According to the direct-conversion principle, the LO signal also has the frequency $f_c$.

The mixers 40, 50 effectively multiply the signal from the amplifier 30 and the I and Q components of the local oscillator. Each mixer produces a signal that has frequencies that are the sum and difference of the frequencies of the amplified filtered received signal and the local oscillator signal. The difference (down-converted) signals each have a spectrum that is folded over around zero frequency (d.c.) and that spans from d.c. to $\frac{1}{2} BW_{rf}$.

The I and Q signals produced by the mixers are filtered by low-pass filters 80, 90 that remove the sum (up-converted) signals, as well as components that might be due to nearby RF signals. The filters 80, 90 set the noise bandwidth and thus the total noise power in the receiver. The I and Q base band signals are then usually amplified by amplifiers 100, 110, and provided to further processing components that produce the demodulated output signal. Such further processing can include phase demodulation, amplitude demodulation, frequency demodulation, or hybrid demodulation schemes.

A major problem with the direct-conversion receiver is that second-order products of interferers (e.g., signals on the same and nearby RF communication channels) are produced by the mixers. One component of these second-order products is located at base band, and thus interferes with the desired base band signal, degrading performance. In some situations, this problem totally blocks communication in high-performance, direct-conversion receivers for today's time division multiple access (TDMA) digital cellular systems.

For an input signal $V_{in}$, a non-linear device, such as a mixer, will produce an output signal $V_{out}$ theoretically given by the following expression:

$$V_{out} = aV_{in} + bV_{in}^2 + \ldots \quad (1)$$

If the input signal $V_{in}$ is an interfering signal given by:

$$V_{in} = V_m \cos(\omega_c t) \quad (2)$$

where $V_m$ is the interferer's maximal amplitude and $\omega_c$ corresponds to the carrier frequency $f_c$, the second-order product $bV_{in}^2$ is given by:

$$bV_{in}^2 = \frac{bV_m^2}{2}[1 + \cos(2\omega_c t)] \quad \text{Eq. 3}$$

It is clear from Eq. 3 that the first term on the right is a distortion on the desired signal at base band, e.g., after the mixers 40, 50. The second term on the right can be neglected since it represents the up-converted (sum) signal centered around twice the carrier frequency that is removed by the filters 80, 90.

The distortion is a d.c. component if the interfering signal is either only a single carrier $f_c$ or a constant-envelope, frequency- or phase-modulated signal. Such a d.c. offset can be removed, for example, in the manner described in U.S. Pat. No. 5,241,702 to Dent, which is hereby expressly incorporated by reference in this application.

If the interferer is in some way an amplitude-modulated (AM) signal, viz., if $V_m$ is not a constant, the second-order product no longer simply introduces a d.c. offset but distortion in the frequency band (d.c. to $\frac{1}{2} BW_{rf}$) of interest. This happens in all digital communication systems due to their use of real AM signals and/or to their use of on/off switching of single-carrier or frequency- or phase-modulated signals. Although direct-conversion receivers are known, none shows how to cope with the high second-order products of the above-described interferers.

Today, direct conversion is not used for high performance cellular mobile receivers. If it were used, however, a large ratio between the desired signal and the interferers and/or a high second-order intercept point (>60 dBm) would be required. It is currently believed the direct-conversion solution is not practical for systems such as ADC, GSM, and DSC 1800 in which these high requirements apply, but direct conversion could be used in systems such as pagers and DECT in which the second-order intercept point requirement is much lower.

SUMMARY

It is an object of this invention to reduce the effect of second-order products of AM signals, which cause interference in the spectral band of the desired signal in a direct-conversion receiver.

It is a further object of this invention to realize a direct-conversion receiver for modern cellular communication systems that does not suffer performance degradation due to strong AM interferers.

These objects are attained by permitting the analog circuitry to pass some second-order products in the desired-signal band. (Anyway, the second-order products could not be completely eliminated because of practical limitations on the second-order intercept point.) The desired frequency band, which thus includes both the desired signal and interfering second-order products, is digitized, and the second-order products are estimated and removed in the digital domain by a digital signal processor.

In one aspect of Applicants' invention, an apparatus for digitally compensating for an interfering signal is provided in a direct-conversion receiver. The apparatus comprises a device for generating digital samples of the base-band in-phase signal and the base-band quadrature signal and a device for detecting the presence of the second-order product signal produced by the interfering signal. Also, the apparatus comprises a device for digitally compensating the digital samples by removing the second-order product signal, thereby producing compensated digital samples.

In another aspect of Applicants' invention, a method of digitally compensating for an interfering signal is provided in a method of receiving an information signal by separating the modulated carrier signal into a base-band in-phase signal and a base-band quadrature signal. The method comprises the steps of generating digital samples of the base-band in-phase signal and the base-band quadrature signal and detecting the presence of the second-order product signal produced by the interfering signal. In the method, the digital samples are digitally compensated by removing the second-order product signal, thereby producing compensated digital samples.

Estimated samples of the second-order product signal of a switched, constant-amplitude interferer may be formed by averaging the digital samples during a first time period and during a subsequent second time period and by determining when ramps in the base-band in-phase signal and the base-band quadrature signal occur between the first and second time periods. Also, the digital samples may be differentiated and the results smoothed in determining the time of the ramps.

In yet another aspect of Applicants' invention, an apparatus for digitally compensating for an amplitude-modulated interfering signal comprises a device for generating digital samples of the base-band in-phase signal and the base-band quadrature signal, a device for generating estimated samples of a second-order product signal produced by the amplitude-modulated interfering signal, and a device for removing the estimated samples from the digital samples, thereby generating compensated digital samples. The estimated-sample generator comprises a device for averaging a square of a difference between respective digital samples of the in-phase signal and the quadrature signal, thereby determining an amplitude of the modulated carrier signal, and a device for combining the amplitude and the digital samples, thereby generating the estimated samples.

In another aspect of Applicants' invention, a method of digitally compensating for an amplitude-modulated interfering signal comprises the steps of generating digital samples of the base-band in-phase signal and the base-band quadrature signal; generating estimated samples of a second-order product signal produced by the amplitude-modulated interfering signal; and removing the estimated samples from the digital samples, thereby generating compensated digital samples. The estimated samples are generated by averaging a square of a difference between respective digital samples of the in-phase signal and the quadrature signal, thereby determining an amplitude of the modulated carrier signal; and combining the amplitude and the digital samples, thereby generating the estimated samples.

BRIEF DESCRIPTION OF THE DRAWINGS

Applicants' invention will be understood by reading this description in conjunction with the drawings in which:

FIGS. 1a, 1b are block diagram of direct-conversion receivers;

DETAILED DESCRIPTION

Figure 1B:
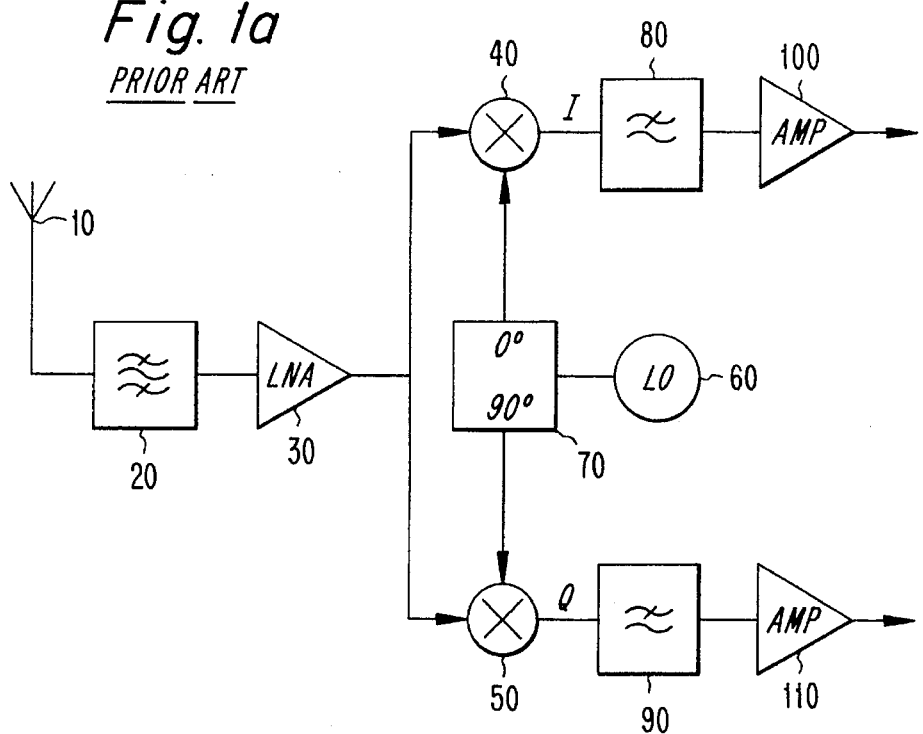
Figure 1B:
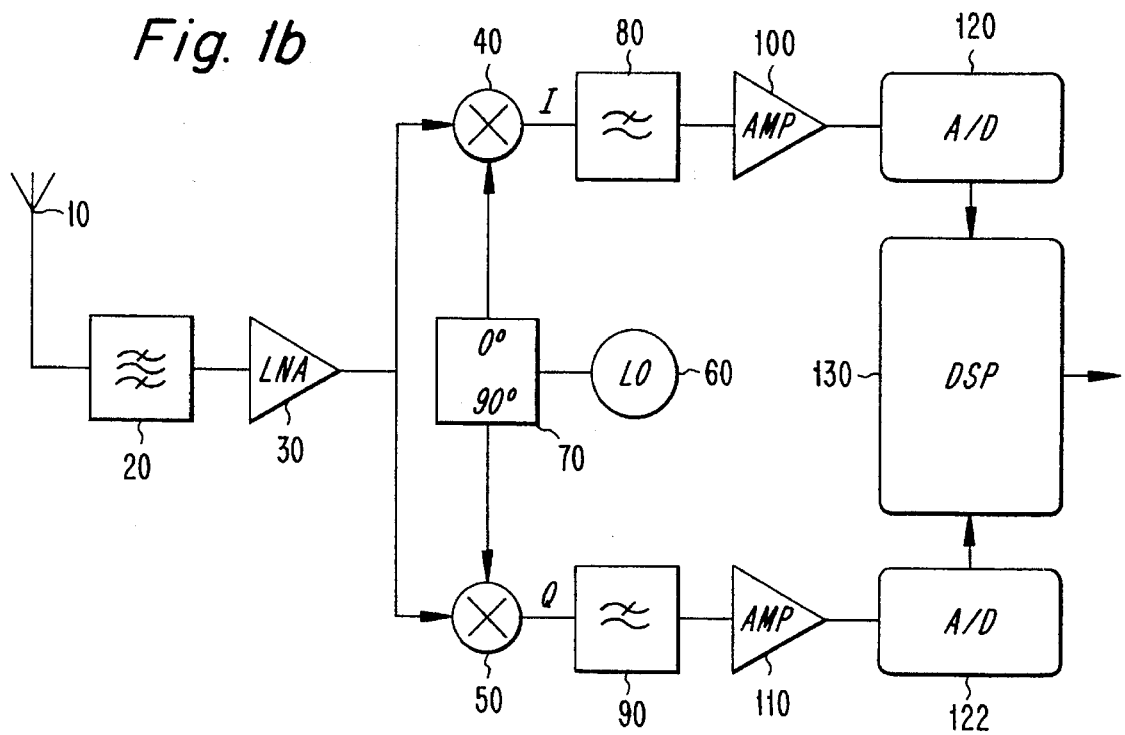

In accordance with one aspect of Applicants' invention, the direct-conversion receiver includes analog-to-digital converters 120, 122 and a digital signal processing (DSP) device 130, as shown by FIG. 1b. Components in FIGS. 1a and 1b having like functions are indicated by like reference numerals. With the configuration shown in FIG. 1b, almost any type of modulation can be detected by programming the DSP device 130 to appropriately manipulate the digital samples of the quadrature I and Q signals. It will be appreciated that the DSP device 130 may be implemented as hard-wired logic circuitry, or, preferably, as an integrated digital signal processor, such as an application-specific integrated circuit (ASIC). Of course it will be understood that an ASIC may include hard-wired logic circuitry that is optimal for performing a required function, which is an arrangement commonly selected when speed or another performance parameter is more important than the versatility of a programmable digital signal processor.

Estimating and removing the second-order products can be advantageously carried out in the digital domain in several ways, which are all within the spirit of this invention. Two examples are described in detail below. The first example is specifically applicable to a GSM direct-conversion receiver. The second example shows a more general digital compensation technique for an arbitrary AM interferer.

Digital Compensation of Second-Order Products in GSM

In GSM, the received signal is phase modulated using GMSK, and ideally, no AM is present within the receive band of 935–960 MHz. Nevertheless, a strong phase-modulated interferer (a blocking signal within the receive band) can introduce a d.c. offset in the base band that interferes with the desired signal. Switching such a strong interferer on and off introduces AM (i.e., a stepping between two different d.c. offsets). In GSM, the time for switching on and off is specified, and therefore the AM distortion is known in the time domain. (Approximately three bit periods are affected.) For a GSM mobile receiver, it is also known that such an interferer can only be switched on or off once during a receive burst; thus, there can be only one d.c.-offset step during any received burst.

Figure 2A:
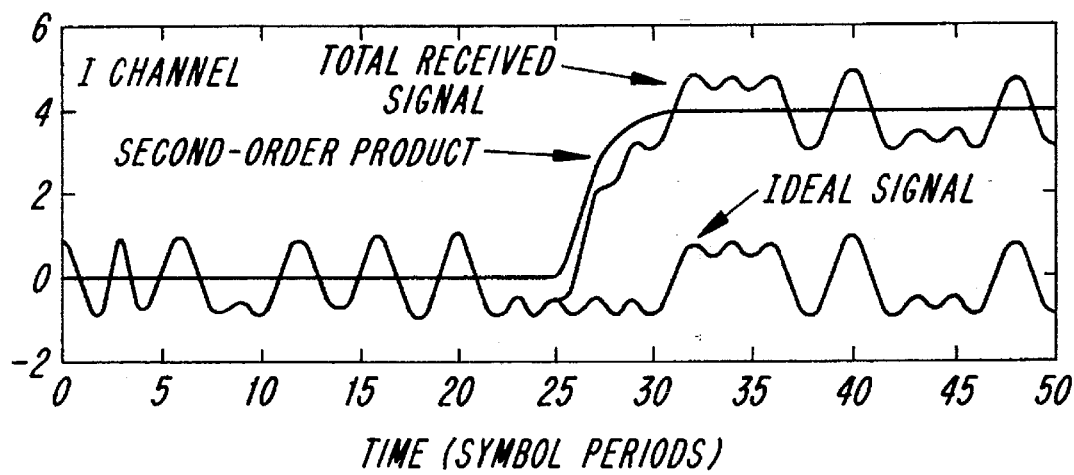
FIGS. 2a, 2b are time diagrams for signals in the I- and Q-channels of a direct-conversion receiver.
Figure 2B:
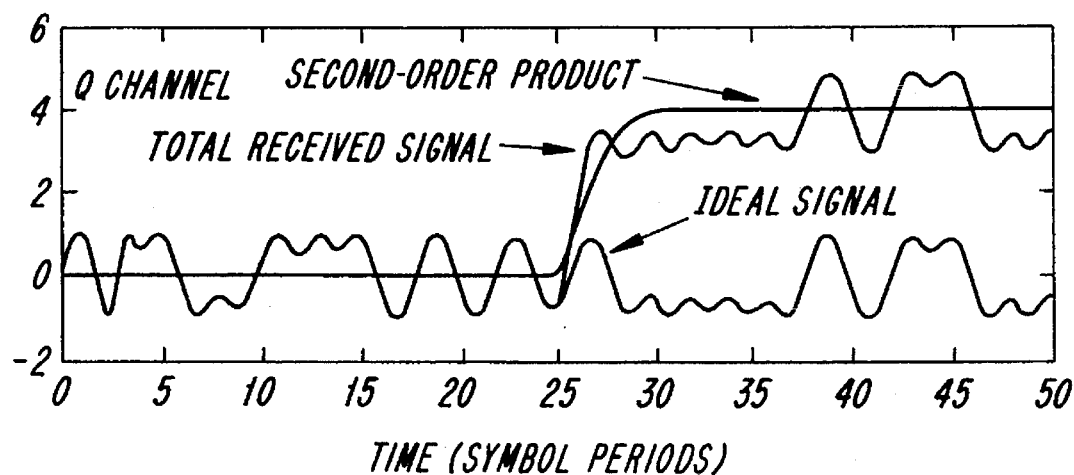

All this knowledge can be used in estimating the second-order product in a complete burst. As shown in FIGS. 2a and 2b, the interfering signal producing the second-order product in the base band I- and Q-channel signals manifests itself in the time domain as two different d.c. levels connected by a ramp (due to the switching on or off) having known characteristics. In the figures, the ideal signal is the signal without the second-order product, and the total received signal is the sum of the ideal signal and the second-order product. The time scales on the abscissas and the amplitude scales on the ordinates are arbitrary.

It will be appreciated that the interfering signal producing the second-order product is in one sense not amplitude-modulated; indeed, in accordance with GSM it is a constant-envelope, phase-modulated signal. Nevertheless, in another sense the interfering signal can be viewed as being amplitude-modulated only during the ramp between the two different d.c. levels. Thus, the second-order product generated by this interfering signal varies only during the ramp and is constant the rest of the time.

Figure 3A:
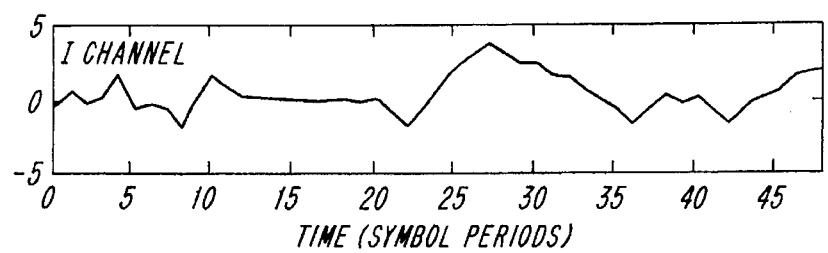
FIGS. 3a–3c are diagrams showing differentiated moving averages and their products.
Figure 3B:
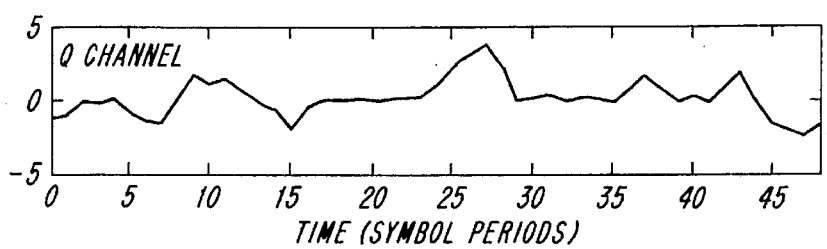

In estimating the second-order product, a sufficiently exact estimate of the time position of the ramp can be determined simply by using a, possibly smoothed, derivative of either of the I- and Q-channel signals. FIGS. 3a and 3b show the signals produced by an example of such processing of the I- and Q-channel signals shown in FIGS. 2a and 2b. In FIGS. 3a and 3b, the curves are the result of differentiating a sliding average of four symbol periods over the complete GSM burst of approximately 160 symbol periods. The size of the maximal absolute value of the differentiated smoothed signal can be used to indicate the presence of the ramp (the most common case), and the time position of the maximal absolute value shows roughly the time position when the ramp occurred. In FIGS. 3a and 3b, it can be seen that the maximal values of the differentiated smoothed base band signals occur at a time position between twenty-five and thirty symbol periods. This is just the time position of the steps shown in FIGS. 2a and 2b.

It will be appreciated that differentiating and smoothing (filtering) are linear operations, so the order in which these functions are carried out does not affect the result. In an actual implementation, one could design a filter that performs the differentiating and the filtering simultaneously. Also, taking a sliding average of a signal is only one way of smoothing; other ways to smooth a signal can be used instead of forming a sliding average.

Figure 3C:
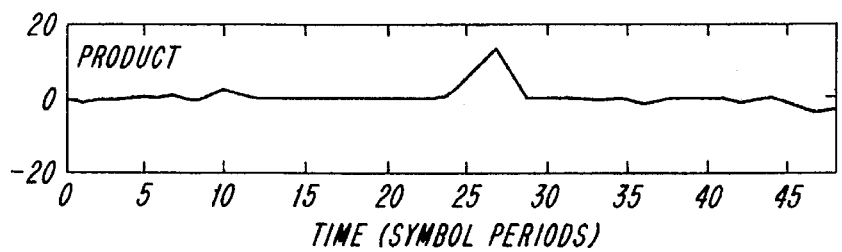

In general, the unknown desired signal modulation limits the accuracy of the estimation of the time position of the ramp in each channel. This is seen in FIGS. 3a and 3b as the amplitude variation of the differentiated smoothed signals. Such error can be dramatically reduced by using the fact that the ramp is substantially identical in both the I- and Q-channels because the second-order product is independent of the local oscillator's phase (and frequency). As seen in FIG. 3c, a signal representing the product of the differentiated smoothed signals has much less amplitude variation, and thus a more accurate estimate of the time position of the ramp can be determined.

It will be appreciated that the whole second-order product in the complete burst is estimated by estimating the two d.c. offset levels and the ramp between them. After an estimate of the time position of the ramp has been determined as described above, the two d.c. levels can be easily estimated by taking the difference between respective averages of samples of the I- and Q-channel signals for given time periods before the ramp and respective averages for given time periods after the ramp. Since the estimated ramp will most conveniently be linear as described below, the estimated time position is used as the position of the mid-point (in temporal extent and amplitude) of the ramp, and the slope of the ramp is determined from the d.c. levels and the known ramp characteristics.

The DSP device 130 then subtracts the estimate of the second-order product from the sampled I- and Q-channel signals produced by the A/D converters 120, 122 on a sample-by-sample basis, thereby producing digitally compensated, "correct" I- and Q-channel signals that may be further processed in the DSP device 130 to obtain the desired information signal.

How many samples of the I- and Q-channel signals are taken during each symbol period (viz., the sampling rate) and the total numbers of samples used in forming the averages affects the accuracy of the estimate of the second-order product. As might be expected, the more samples that are available, the better is the accuracy. The sampling rate is often set by other system requirements, and those requirements might have to be revised in a tradeoff to increase the sampling rate should the second-order product be compensated only poorly due to too few samples. Moreover, the numbers of samples available for averaging during the "constant" portions of the signals depend on where the ramp occurs, which is beyond the control of the receiver. It is currently believed that only about ten samples should be sufficient for forming such an average, although it is expected that other numbers of samples may be used.

Figure 4:
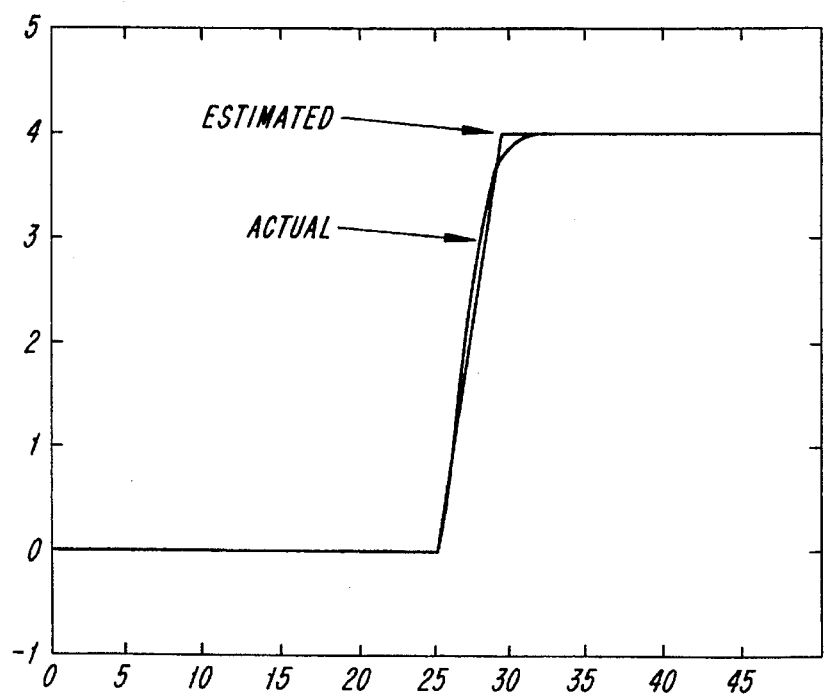
FIG. 4 is a diagram showing an actual second-order product and an estimated second-order product.

Subtracting the estimated ramped, constant-envelope signal may leave, or even create, some second-order-product distortion in the I- and Q-channel signals depending on how closely the estimated signal approximates the actual interfering signal. This is illustrated in FIG. 4, which shows an estimated signal having a linear ramp and an actual signal having a slightly curved ramp. In the worst case, a few information symbols could be lost due to differences between the estimated and actual interfering signals. This can often be neglected in communication systems having robust channel coding and interleaving, such as the GSM and DCS 1800 systems.

The precise curvature of the ramp depends on how the interfering transmitter increases and decreases its output power. In a communication system such as GSM, the characteristics of the interferer's output power changes are specified, and thus the ramp's general characteristics, such as its temporal width, are known in advance, but not the exact curvature. Besides, the received signal is "filtered" according to the receiver's impulse response, and the curvature of the ramp is further changed accordingly. If exact knowledge of either or both of these phenomena is available, it could be used in estimating the second-order product. Usually, however, the inexact knowledge of the interferer limits the usefulness of even exact knowledge of the receiver's impulse response. Accordingly, using a linear ramp in forming the estimate of the second-order product will typically be sufficient.

When the temporal width of the ramp is not already known, for example from knowledge of the communication system, the slope of the ramp, which is simply the difference between the d.c. offset levels before and after the ramp (see, e.g., FIG. 2a) divided by the ramp's temporal width, can still be determined by the DSP device 130 in several ways. For example, the DSP device 130 can estimate the ramp's temporal width by determining the temporal width of a portion of the absolute value of either the product of the differentiated smoothed signal samples (FIG. 3c) or the differentiated smoothed signal samples themselves (FIGS. 3a or 3b) that exceeds a predetermined threshold.

As noted above, the size of the maximal absolute value of the differentiated smoothed signal can be used to indicate the presence of the ramp, which can initiate the further signal processing described in this application. When the DSP device 130 determines that the maximal absolute value has exceeded another predetermined threshold, it can be said that the DSP device 130 has detected the presence of an interfering signal or a second-order product signal. It will be appreciated that the DSP device 130 can detect the interferer's or second-order product signal's presence in other ways, for example by simply determining that one of the following has exceeded (or fallen below) a predetermined threshold: the product of the differentiated smoothed signals (FIG. 3c); either or both of the differentiated smoothed signals (FIGS. 3a and 3b); and either or both of the base band signals (FIGS. 2a and 2b).

Figure 5A:
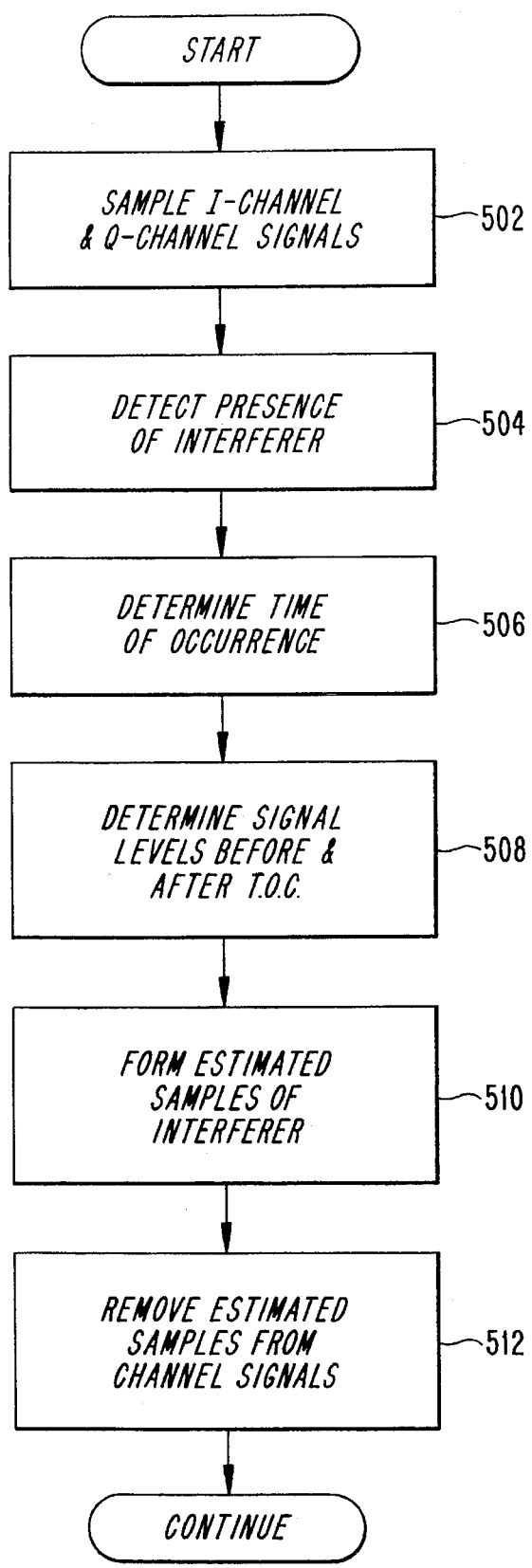
FIGS. 5a, 5b are flowcharts of methods in accordance with the invention.
Figure 5B:
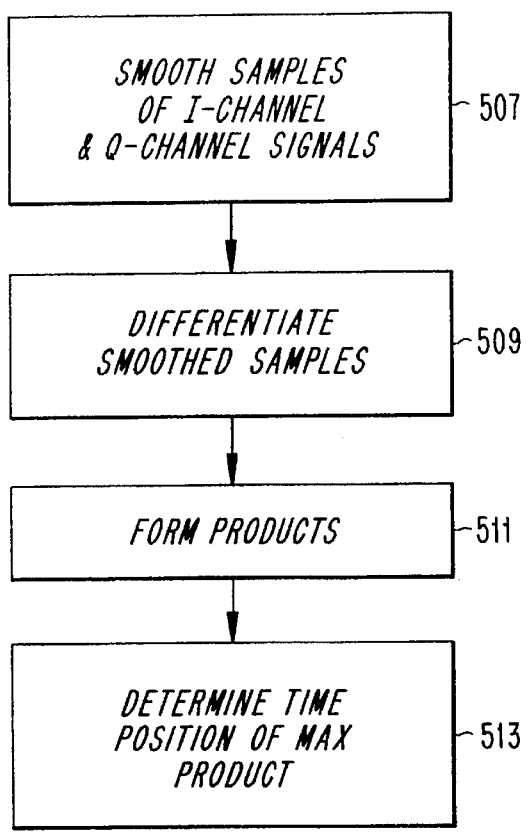

The steps carried out by the DSP device 130 in performing these compensating methods are illustrated in the flowcharts of FIGS. 5a and 5b. The method begins in FIG. 5a with sampling the I-channel and Q-channel signals in step 502 and detecting the presence of the interferer as described above in step 504. When an interferer has been detected, the time of the associated signal ramp's occurrence and the levels of the channel signals before and after the ramp are determined (steps 506, 508) so that estimated samples of the interfering signal can be formed (step 510). The estimated samples are removed from the channel signal samples (step 512), and the resulting compensated channel signal samples are further processed, e.g., for detecting or recovering the information signal transmitted.

FIG. 5b shows a flowchart of one of the above-described methods for determining the time of occurrence of the signal ramp due to the interferer (step 506 in FIG. 5a). The signal samples from both the I-channel and the Q-channel are smoothed, e.g., by forming sliding averages, in step 507, and the smoothed channel signals are differentiated in step 509. Products of the differentiated signals are formed sample-by-sample, as described above, in step 511, and the time of occurrence of the ramp is determined in step 513 from the time position of the maximal value of the products (see FIG. 3c).

Digital Compensation of Arbitrary AM Interferers

For continuous, completely amplitude-modulated interfering signals, the simple method of estimating the interfering signal (second-order product) that is described above for GSM is inadequate. Adding an AM signal to the desired signal makes single-channel removal impossible. As noted above, a direct-conversion receiver for GSM (and all quadrature modulation schemes) has two base band channels, the I- and Q-channels. Moreover, the second-order product of an AM interferer in such a receiver should be exactly the same in both channels since the products are only related to the second-order distortions of non-linear devices (which would be equal for matched mixers) and are independent of the local oscillator's phase (and frequency). This can be expressed as follows:

$$y_I(t)=I(t)+p_2(t)$$

$$y_Q(t)=Q(t)+p_2(t) \quad (4)$$

where $y_I(t)$ is the value of a sample taken at time t of the base band signal in the I-channel, I(t) is the ideal value of the I-channel signal sample, and $p_2(t)$ is the value of the second-order interfering product. The parameters in the expression for the Q-channel are similarly defined.

It will be understood that it is not necessary for the I- and Q-channels to be orthogonal, as they would be in a receiver for quadrature-modulated signals. Although Applicants' invention must be embodied in a receiver that has two channels, it is sufficient that the channels span the I-Q plane. Thus, the terms "in-phase signal" and "quadrature signal" should not be interpreted as requiring orthogonality, except when used in combination with others, such as "quadrature modulation", that are conventionally understood to require such a relationship.

It is assumed in this description that noise does not interfere. Noise degrades the performance, but not much because it is usually much smaller than the desired signal. For example, the input signal-to-noise ratio (SNR) in GSM is typically at least 10 dB.

The second-order product can be viewed as a common-mode distortion on both channels. It can be seen that Eq. 4 is a system of two equations having three unknowns, and thus one more equation is needed for the system to be solved. Knowledge of the characteristics of the interferer could yield such a third equation, but in this example those characteristics have been assumed to be arbitrary. Nevertheless, the input amplitude of the desired signal can be used to obtain one more relation, which can be expressed by the following well known equation:

$$r^2(t)+I^2(t)+Q^2(t) \quad (5)$$

where r(t) is the amplitude of the input signal, and I(t) and Q(t) are as defined in Eq. 4. Those of skill in the art will recognize that the signal locus described by Eq. 5 is a circle having radius r in the complex plane. The squared input signal amplitude $r^2(t)$ can be determined by squaring the difference between the input signals in the I- and Q-channels; this is given by the following expression:

$$[y_I(t)-y_Q(t)]^2=r^2(t)-2I(t)Q(t) \quad (6)$$

If the desired signal is only frequency- or phase-modulated, i.e., if the signal amplitude r(t) is substantially constant, the signal amplitude can be determined by averaging the squared difference during a certain time period. This is given by the following expression:

$$r^2 = \frac{1}{n} \sum_{i=1}^{n} [y_I(iT_s) - y_Q(iT_s)]^2 = \text{constant} \qquad \text{Eq. 7}$$

where n is the total number of samples obtained at sampling times $T_s$ that is used in forming the average.

Now the system of Eq. 4 can be completely solved. The samples of the second-order interfering signal can be expressed, after application of the quadratic formula, by the following equation:

$$p_2(t) = \frac{y_I(t) + y_Q(t)}{2} - \sqrt{\frac{r^2}{2} - \frac{y_I(t) - y_Q(t)}{4}} \qquad \text{Eq. 8}$$

in which the parameters are as defined in the preceding equations.

From Eq. 8, it can be seen that the second-order products of any arbitrary AM interferer can be removed in the digital domain, if the amplitude of the desired signal is substantially constant. It is a simple matter to program the DSP device 130 to determine the samples $p_2(t)$ from the samples $y_I(t)$ and $y_Q(t)$ of the I- and Q-channel base-band signals and then subtract the $p_2(t)$ samples from the $y_I(t)$ and $y_Q(t)$ samples on a sample-by-sample basis to generate compensated samples I(t) and Q(t) of the I- and Q-channel signals. It is not even necessary to detect the presence of the interferer or second-order product signal, since the compensation according to Eq. 8 does not rely on the same characteristics of the interferer as does the compensation specific for GSM and like communication systems. Therefore, the digitally compensated direct-conversion receiver can be much more resistant to AM interference than a conventional analog receiver.

Figure 6:
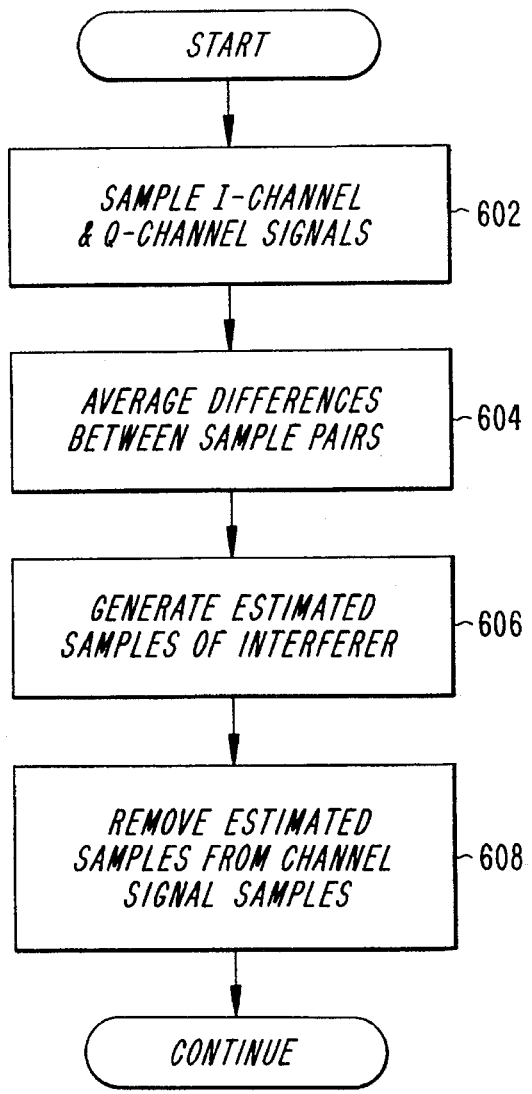
FIG. 6 is a flowchart of another method in accordance with the invention.

The steps carried out by the DSP device 130 in performing this compensating method are illustrated in FIG. 6. The method begins with sampling the I-channel and Q-channel signals in step 602 and determining the amplitude of the desired signal by averaging differences between respective samples in step 604. Estimated samples of the second-order product signal are then generated in step 606 from the desired-signal amplitude and the channel signal samples. Compensated samples are produced in step 608 by removing these estimated samples from the channel signal samples.

It will be understood that both fading and time dispersion affect the accuracy of the digital compensation. It is usually very difficult, if not impossible, to separate such signal variations from the second-order-product signal variation intended to be compensated by Applicants' invention. Even so, there are many systems in which fading and/or dispersion will not cause significant problems. For example, when the data bursts are short enough (or when the receiver's speed is low), fading should not significantly affect the compensation. Also, when the receiver is close to the transmitter (which is usually the only time when a second-order product is strong), time dispersion is low.

While particular embodiments of Applicants' invention have been described and illustrated, it is understood that modifications may be made by persons skilled in the art. Accordingly, the scope of Applicants' invention is limited only by the following claims, and any and all modifications that fall within the spirit and scope of those claims are intended to be disclosed and claimed herein.

What is claimed is:

1. In a direct-conversion receiver for recovering an information signal from a carrier signal modulated by the information signal, in which the modulated carrier signal is separated into a base-band in-phase signal and a base-band quadrature signal, an apparatus for digitally compensating for an interfering signal comprising:

first means for generating digital samples of the base-band in-phase signal and the base-band quadrature signal;

means for detecting a presence of a second-order product signal having a time-varying spectral content produced by the interfering signal; and means, in communication with the first means and the detecting means, for digitally compensating the digital samples by removing the second-order product signal, thereby producing compensated digital samples, wherein the compensating means applies to the digital samples a non-linear, time-varying compensation corresponding to the spectral content of the second-order product signal.

2. The apparatus of claim 1, wherein the second-order product signal is produced by a ramped, constant-envelope, interfering signal and the compensating means includes:

means for detecting a time position of the second-order product signal based on the digital samples of at least one of the base-band in-phase signal and the base-band quadrature signal, means for averaging digital samples of the at least one signal, the averaging means forming a first average of digital samples during a first time period before the time position and a second average of digital samples during a second time period after the time position, second means for generating estimated samples of the second-order product signal based on the time position and the first and second averages, and means for subtracting the estimated samples from the digital samples.

3. The apparatus of claim 2, wherein the detecting means comprises:

means for smoothing digital samples of the at least one signal, means for differentiating smoothed digital samples of the at least one signal, and means for determining a time position of a maximal value of differentiated smoothed digital samples of the at least one signal.

4. The apparatus of claim 2, wherein the detecting means comprises:

means for smoothing digital samples of the base-band in-phase signal and the base-band quadrature signal, means for differentiating smoothed digital samples of the in-phase signal and the quadrature signal, means for forming products of differentiated smoothed digital samples of the in-phase signal and the quadrature signal, and means for determining a time position of a maximal value of the products, and the averaging means forms a first average of digital samples of the base-band in-phase signal and a first average of digital samples of the base-band quadrature signal during a first time period before the time position, and a second average of digital samples of the base-band in-phase signal and a second average of digital samples of the base-band quadrature signal during a second time period after the time position, the second means generates estimated samples of the second-order product signal based on the time position, the first averages, and the second averages, and the subtracting means removes the second-order product signal by subtracting the estimated samples from the digital samples.

5. The apparatus of claim 1, further comprising means for separating the modulated carrier signal into the base-band in-phase signal and the base-band quadrature signal, wherein the base-band in-phase signal is substantially orthogonal to the base-band quadrature signal.

6. In a method of recovering an information signal from a carrier signal modulated by the information signal that includes separating the modulated carrier signal into a base-band in-phase signal and a base-band quadrature signal, a method of digitally compensating for an interfering signal comprising the steps of:

generating digital samples of the base-band in-phase signal and the base-band quadrature signal;

detecting a presence of a second-order product signal having a time-varying spectral content produced by the interfering signal; and digitally compensating the digital samples by removing the second-order product signal, thereby producing compensated digital samples, wherein a non-linear, time-varying compensation corresponding to the spectral content of the second-order product signal is applied to the digital samples.

7. The method of claim 6, wherein the second-order product signal is produced by a ramped, constant-envelope, interfering signal and the compensating step includes the steps of:

detecting a time position of the second-order product signal, forming a first average of digital samples of at least one of the base-band in-phase signal and the base-band quadrature signal during a first time period before the time position, forming a second average of digital samples of the at least one signal during a second time period after the time position, generating estimated samples of the second-order product signal based on the time position and the first and second averages, and removing the second-order product signal by subtracting the estimated samples from the digital samples.

8. The method of claim 7, wherein the step of detecting the time position comprises the steps of:

smoothing digital samples of the at least one signal, differentiating smoothed digital samples of the at least one signal, and determining a time position of a maximal value of differentiated smoothed digital samples of the at least one signal.

9. The method of claim 7, wherein the step of detecting the time position comprises the steps of:

smoothing digital samples of the base-band in-phase signal and the base-band quadrature signal, differentiating smoothed digital samples of the in-phase signal and the quadrature signal, forming products of differentiated smoothed digital samples of the in-phase signal and the quadrature signal, and determining a time position of a maximal value of the products, and a first average of digital samples of the base-band in-phase signal and a first average of digital samples of the base-band quadrature signal during a first time period before the time position are formed, a second average of digital samples of the base-band in-phase signal and a second average of digital samples of the base-band quadrature signal during a second time period after the time position are formed, estimated samples of the second-order product signal are generated based on the time position, the first averages, and the second averages, and the second-order product signal is removed by subtracting the estimated samples from the digital samples.

10. The method of claim 6, further comprising the step of separating the modulated carrier signal into the base-band in-phase signal and the base-band quadrature signal, wherein the base-band in-phase signal is substantially orthogonal to the base-band quadrature signal.

11. In a direct-conversion receiver for recovering an information signal from a carrier signal modulated by the information signal, in which the modulated carrier signal is separated into a base-band in-phase signal and a base-band quadrature signal, an apparatus for digitally compensating for an amplitude-modulated interfering signal comprising:

first means for generating digital samples of the base-band in-phase signal and the base-band quadrature signal;

second means for generating estimated samples of a second-order product signal produced by the amplitude-modulated interfering signal, wherein the second means comprises:

first means for averaging a square of a difference between respective digital samples of the in-phase signal and the quadrature signal, thereby determining an amplitude of the modulated carrier signal; and means for combining the amplitude and the digital samples, thereby generating the estimated samples; and means for removing the estimated samples from the digital samples, thereby generating compensated digital samples.

12. The apparatus of claim 11, wherein the combining means includes:

second means for averaging respective digital samples of the in-phase signal and the quadrature signal, and means for generating differences between respective digital samples of the in-phase signal and the quadrature signal, and the removing means subtracts the estimated samples from the digital samples.

13. The apparatus of claim 11, further comprising means for separating the modulated carrier signal into the base-band in-phase signal and the base-band quadrature signal, wherein the base-band in-phase signal is substantially orthogonal to the base-band quadrature signal.

14. In a direct-conversion receiver for recovering an information signal from a carrier signal modulated by the information signal, in which the modulated carrier signal is separated into a base-band in-phase signal and a base-band quadrature signal, a method of digitally compensating for an amplitude-modulated interfering signal comprising the steps of:

generating digital samples of the base-band in-phase signal and the base-band quadrature signal;

generating estimated samples of a second-order product signal produced by the amplitude-modulated interfering signal by the steps of:

averaging a square of a difference between respective digital samples of the in-phase signal and the quadrature signal, thereby determining an amplitude of the modulated carrier signal; and combining the amplitude and the digital samples, thereby generating the estimated samples; and removing the estimated samples from the digital samples, thereby generating compensated digital samples.

15. The method of claim 14, wherein the combining step includes the steps of:
  averaging respective digital samples of the in-phase signal and the quadrature signal, and
  generating differences between respective digital samples of the in-phase signal and the quadrature signal, and
  the estimated samples are removed from the digital samples by subtraction.

16. The apparatus of claim 14, further comprising the step of separating the modulated carrier signal into the base-band in-phase signal and the base-band quadrature signal, wherein the base-band in-phase signal is substantially orthogonal to the base-band quadrature signal.

* * * * *